United States Patent
Lee

(10) Patent No.: US 12,342,735 B2
(45) Date of Patent: Jun. 24, 2025

(54) SEMICONDUCTOR DEVICE AND METHOD OF FABRICATING THE SAME

(71) Applicant: SK hynix Inc., Icheon (KR)

(72) Inventor: Woo Tae Lee, Icheon (KR)

(73) Assignee: SK hynix Inc., Icheon-si (KR)

( * ) Notice: Subject to any disclaimer, the term of this patent is extended or adjusted under 35 U.S.C. 154(b) by 158 days.

(21) Appl. No.: 18/305,914

(22) Filed: Apr. 24, 2023

(65) Prior Publication Data

US 2024/0172571 A1    May 23, 2024

(30) Foreign Application Priority Data

Nov. 21, 2022  (KR) .................. 10-2022-0156397

(51) Int. Cl.
*G11C 13/00*  (2006.01)
*H10N 70/00*  (2023.01)

(52) U.S. Cl.
CPC ....... H10N 70/826 (2023.02); G11C 13/0026 (2013.01); G11C 13/0028 (2013.01); H10N 70/063 (2023.02); H10N 70/066 (2023.02)

(58) Field of Classification Search
CPC .. H10N 70/826; H10N 70/063; H10N 70/066; H10N 70/011; G11C 13/0026; G11C 13/0028; G11C 2213/71; H01L 2224/08145; H01L 25/0657; H01L 2224/32135; H10B 61/00; H10B 63/10; H10B 63/00; H10B 20/25; H10B 51/30; H10B 53/30; H10B 63/80; H10B 63/30
USPC ................................. 365/148, 158
See application file for complete search history.

(56) References Cited

U.S. PATENT DOCUMENTS

| | | | |
|---|---|---|---|
| 11,756,616 B2* | 9/2023 | Nakao ............... | G11C 13/0026 365/148 |
| 2007/0059945 A1* | 3/2007 | Mohklesi .......... | G11C 16/0483 257/E21.267 |
| 2010/0259961 A1* | 10/2010 | Fasoli ................ | G11C 11/5685 365/51 |
| 2011/0069533 A1* | 3/2011 | Kurosawa .......... | G11C 13/0007 365/230.03 |
| 2012/0069628 A1* | 3/2012 | Ito ..................... | G11C 13/0064 365/148 |
| 2013/0134383 A1* | 5/2013 | Hwang ............... | H10B 63/20 257/5 |
| 2013/0215666 A1* | 8/2013 | Lee .................... | G11C 13/0002 365/148 |

(Continued)

FOREIGN PATENT DOCUMENTS

KR    1020200067617 A    6/2020

*Primary Examiner* — Michael T Tran

(57) ABSTRACT

A semiconductor device and a method for fabricating the same may be provided. The semiconductor device may include: a first semiconductor structure including a substrate, a plurality of first word lines, a plurality of first bit lines, and a plurality of first memory cells respectively disposed in intersection regions between the first word lines and the first bit lines; and a second semiconductor structure including a plurality of second bit lines disposed over the first bit lines and respectively contacting the first bit lines, a plurality of second word lines, and a plurality of second memory cells respectively disposed in intersection regions between the second word lines and the second bit lines, wherein a first bit line and a corresponding second bit line form a metal-to-metal bonding.

30 Claims, 11 Drawing Sheets

(56) References Cited

U.S. PATENT DOCUMENTS

| | | | | |
|---|---|---|---|---|
| 2014/0347911 A1* | 11/2014 | Minemura | ............ | H10N 70/063 |
| | | | | 365/148 |
| 2015/0263277 A1* | 9/2015 | Ozawa | ............... | H10N 70/8416 |
| | | | | 257/5 |
| 2020/0312815 A1* | 10/2020 | Morein | .................... | H01L 29/45 |
| 2021/0083185 A1* | 3/2021 | Jung | ....................... | H10B 63/80 |
| 2021/0110871 A1* | 4/2021 | Ban | .................... | G11C 13/0004 |
| 2022/0139767 A1* | 5/2022 | Lee | ......................... | H01L 25/16 |
| | | | | 257/183 |
| 2022/0285322 A1* | 9/2022 | Or-Bach | ............... | H01L 23/522 |
| 2022/0302382 A1* | 9/2022 | Hoshino | .............. | H10N 70/043 |
| 2023/0301218 A1* | 9/2023 | Park | .................. | H10N 70/8828 |
| | | | | 365/148 |
| 2023/0317155 A1* | 10/2023 | Takizawa | ............. | G11C 13/004 |
| | | | | 365/148 |
| 2024/0071544 A1* | 2/2024 | Zainuddin | ............... | H01L 25/18 |

* cited by examiner

SEMICONDUCTOR DEVICE AND METHOD OF FABRICATING THE SAME

CROSS-REFERENCE TO RELATED APPLICATION

This application claims priority under 35 U.S.C. § 119 to Korean Patent Application No. 10-2022-0156397 filed on Nov. 21, 2022, which is incorporated herein by reference in its entirety.

BACKGROUND

1. Technical Field

This patent document relates to a semiconductor technology, and particularly, to a semiconductor device and a method of fabricating the same.

2. Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

In an embodiment, a semiconductor device may include: a first semiconductor structure including a substrate, a plurality of first word lines disposed over the substrate and extending in a first direction, a plurality of first bit lines disposed over the first word lines and extending in a second direction crossing the first direction, and a plurality of first memory cells respectively disposed in intersection regions between the first word lines and the first bit lines in a third direction perpendicular to the first and the second directions; and a second semiconductor structure including a plurality of second bit lines disposed over the first bit lines and respectively contacting the first bit lines, a plurality of second word lines disposed over the second bit lines and extending in the first direction, and a plurality of second memory cells respectively disposed in intersection regions between the second word lines and the second bit lines in the third direction, wherein a first bit line and a corresponding second bit line form a metal-to-metal bonding.

In another embodiment, a semiconductor device may include: a first semiconductor structure including a substrate, a plurality of first word lines disposed over the substrate and extending in a first direction, a plurality of first bit lines disposed over the first word lines and extending in a second direction crossing the first direction, and a plurality of first memory cells respectively disposed in intersection regions between the first word lines and the first bit lines in a third direction perpendicular to the first and the second directions; a second semiconductor structure including a plurality of second bit lines disposed over the first bit lines and respectively contacting the first bit lines, a plurality of second word lines disposed over the second bit lines and extending in the first direction, and a plurality of second memory cells respectively disposed in intersection regions between the second word lines and the second bit lines in the third direction; and a first word line contact structure configured to electrically connect a second word line to the substrate, and penetrating the second word line.

In another embodiment, a method for fabricating a semiconductor device, may include: providing a first semiconductor structure including a first substrate, a plurality of first word lines disposed over the first substrate and extending in a first direction, a plurality of first bit lines disposed over the first word lines and extending in a second direction crossing the first direction, and a plurality of first memory cells respectively disposed in intersection regions between the first word lines and the first bit lines in a third direction perpendicular to the first and the second directions; providing a second semiconductor structure including a second substrate, a plurality of second word lines disposed over the second substrate and extending in the first direction, a plurality of second bit lines disposed over the second word lines and extending in the second direction, and a plurality of second memory cells respectively disposed in intersection regions between the second word lines and the second bit lines in the third direction; and forming a metal-to-metal bonding between a first bit line and a second bit lines by performing a heat treatment while the first bit line and the second bit line are in direct contact with each other.

DETAILED DESCRIPTION

Figure 1:
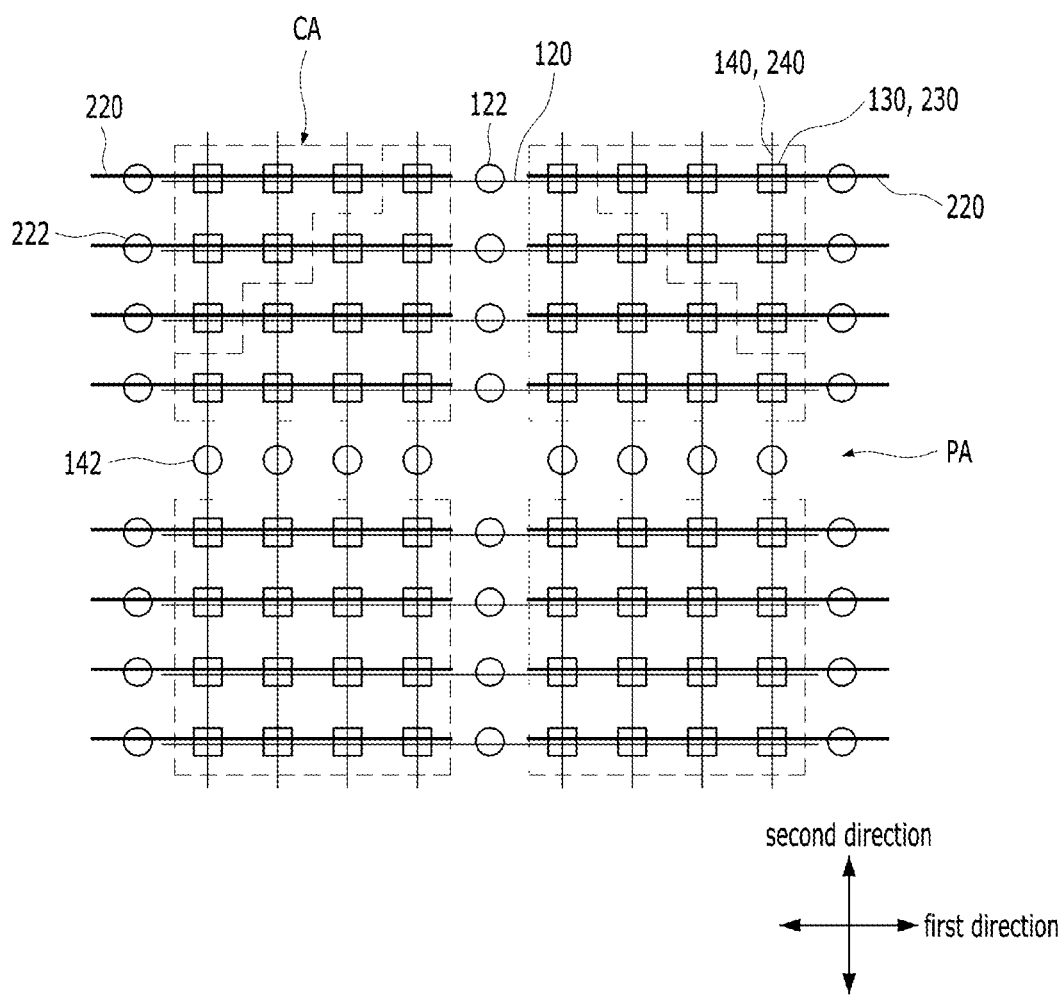
FIG. 1 is a plan view illustrating a semiconductor device according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 5A:
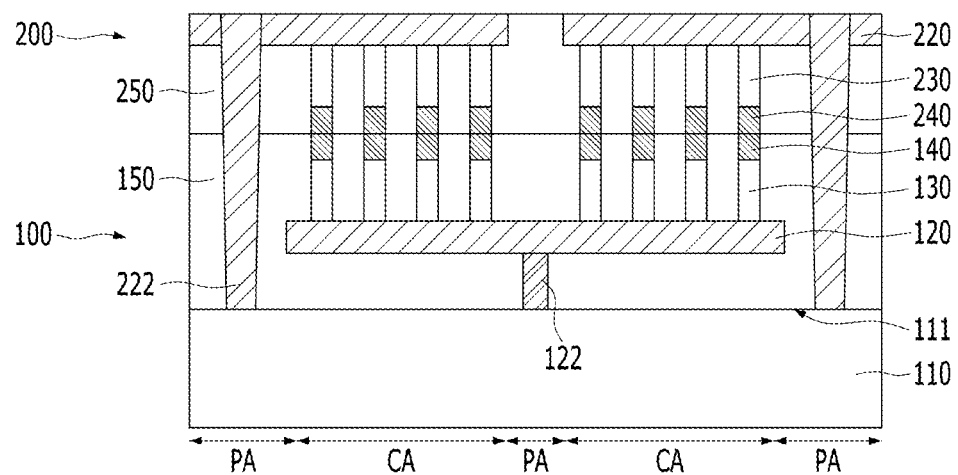
FIGS. 5A and 5B are cross-sectional views taken along a first direction and a second direction of the semiconductor device of FIG. 1, respectively.
Figure 5B:
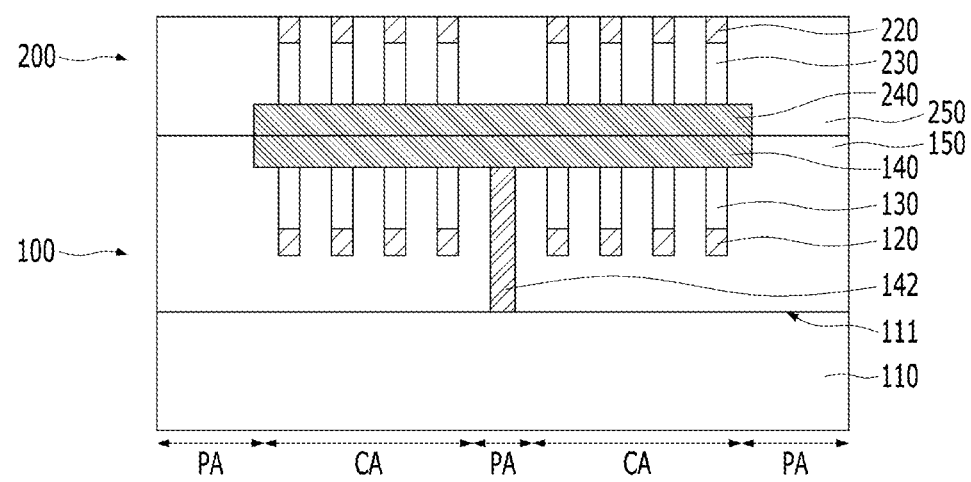

FIG. 1 is a plan view illustrating a semiconductor device according to an embodiment of the present disclosure, and FIGS. 5A and 5B are cross-sectional views taken along a first direction and a second direction of the semiconductor device of FIG. 1, respectively.

Figure 2A:
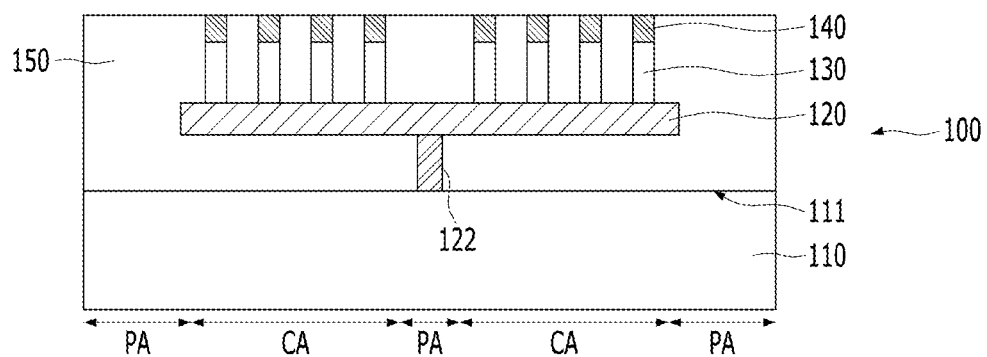
FIGS. 2A to 2C, 3A to 3C, and 4A to 4C are cross-sectional views illustrating a fabricating method of the semiconductor device of FIG. 1.
Figure 2B:
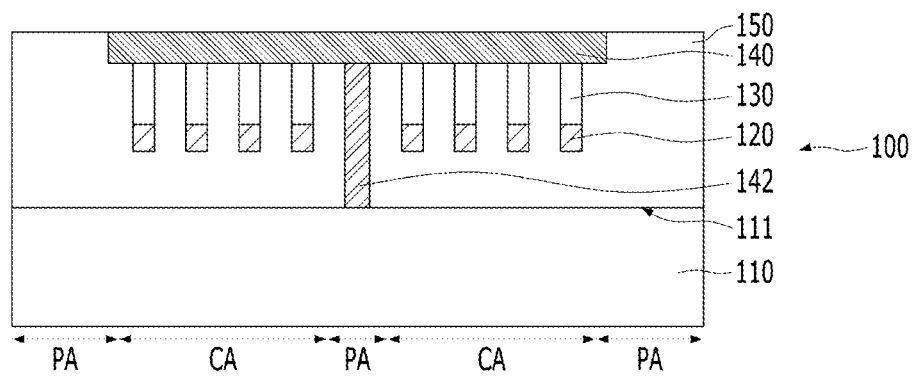
Figure 2C:
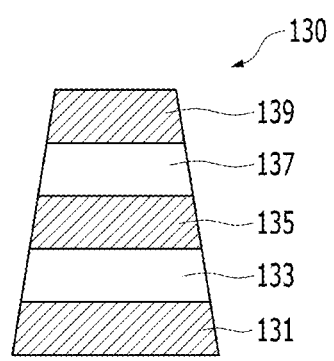
Figure 3A:
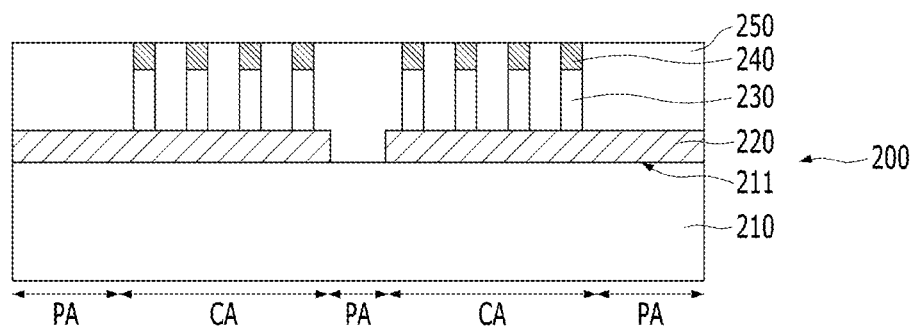
Figure 3B:
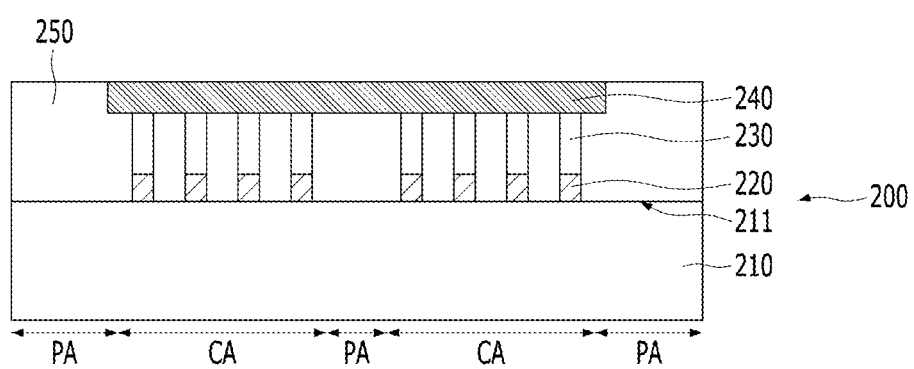
Figure 3C:
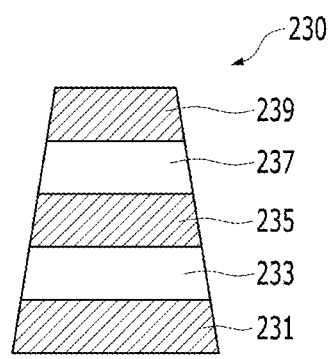
Figure 4A:
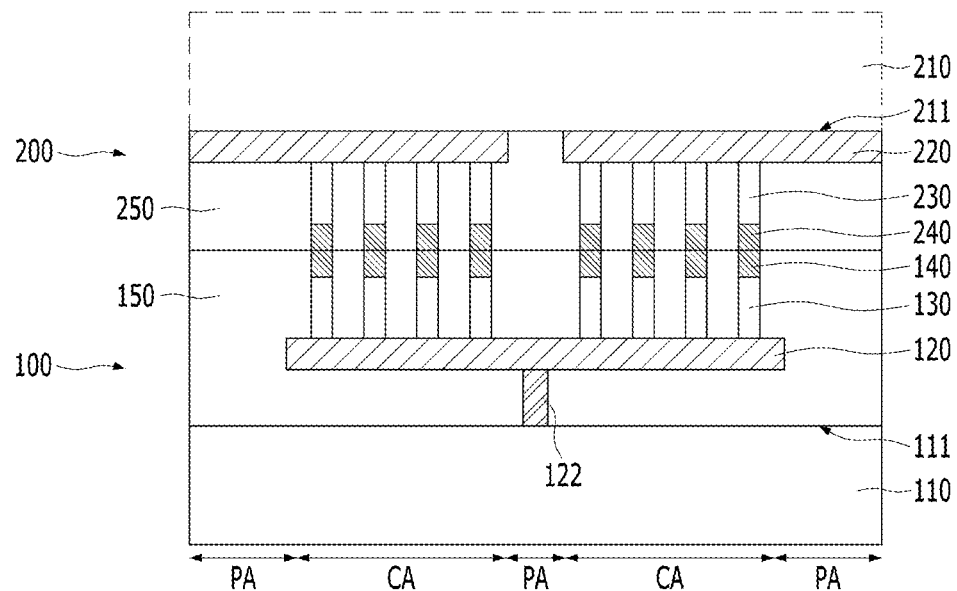

FIGS. 2A to 2C, 3A to 3C, and 4A to 4C are cross-sectional views illustrating a fabricating method of the semiconductor device of FIGS. 1, 5A, and 5B. FIGS. 2A, 3A, and 4A are cross-sectional views taken along the first direction of FIG. 1, and FIGS. 2B, 3B, and 4B are cross-sectional views taken along the second direction of FIG. 1.

First, the fabricating method will be described.

Referring to FIGS. 1, 2A, and 2B, a first semiconductor structure 100 may be provided. The first semiconductor structure 100 may include a first substrate 110, a plurality of first word lines 120 disposed over a first surface 111 of the first substrate 110, a plurality of first bit lines 140 disposed over the first word lines 120 and crossing the first word lines 120, and a plurality of first memory cells 130 disposed between the first word lines 120 and the first bit lines 140 in a vertical direction and overlapping intersection regions of the first word lines 120 and the first bit lines 140, respectively, when viewed in a plan view. The first and second directions are substantially parallel to the first surface 111 and cross each other, and the vertical direction is perpendicular to the first and second directions.

The first substrate 110 may include a semiconductor material such as silicon. Also, although not shown, the first substrate 110 may include a driving circuit for driving the first word lines 120 and the first bit lines 140. Furthermore, the first substrate 110 may also include a driving circuit for driving second word lines and second bit lines to be described later.

The first substrate 110 may include a cell region CA and a peripheral circuit region PA. In this embodiment, the cell region CA may have a quadrangular shape in a plan view, and four cell regions CA may be spaced apart from each other in a 2*2 matrix form in the first and second directions. Also, in a plan view, the peripheral circuit region PA may be positioned between and outside the cell regions CA, and thus the peripheral circuit region PA may have a cross shape or a lattice shape as a whole. However, embodiments are not limited thereto, and thus the shape, number, and arrangement of the cell region(s) CA and the peripheral circuit region PA may be variously modified.

The first word line 120 may extend in the first direction and cross two cell regions CA arranged in the first direction and the peripheral circuit region PA between the two cell regions CA. The first word lines 120 may be arranged to be spaced apart from each other in the second direction. The second direction may be substantially perpendicular to the first direction. The first word line 120 may include any of various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof.

Referring to FIG. 2A, each of the first word lines 120 may be electrically connected to a portion of the first substrate 110, for example, a circuit for driving the first word line 120, through a first word line contact structure 122 connected to the first word line 120 and disposed under the first word line 120. The first word line contact structure 122 may be disposed in the peripheral circuit region PA between the two cell regions CA in the first direction.

For reference, a contact structure may refer to a structure extending in a vertical direction and electrically connecting components disposed above and below the contact structure, and may be formed of a single pattern or a plurality of patterns stacked in the vertical direction.

Although the cross-sectional view of FIG. 2A shows that the first word line contact structure 122 is made of one contact plug, embodiments are not limited thereto. In another embodiment, the first word line contact structure 122 may include two or more contact plugs or a combination of one or more contact plugs and one or more contact pads. The first word line contact structure 122 may include any of various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof.

The first bit line 140 may extend in the second direction and cross two cell regions CA arranged in the second direction and the peripheral circuit region PA between the two cell regions CA. The first bit lines 140 may be arranged to be spaced apart from each other in the first direction. The first bit line 140 may include any of various conductive materials. In particular, the first bit line 140 may include a metallic material capable of forming a hybrid bond with a second bit line 240 described below. That is, the first bit line 140 may include a metallic material that can be coupled to another metallic material by interdiffusion of metals through a high-temperature annealing process. As an example, the first bit line 140 may include a metallic material such as one of copper (Cu), nickel (Ni), tin (Sn), gold (Au), and silver (Ag), a combination thereof, or a compound thereof.

Referring to FIG. 2B, each of the first bit lines 140 may be electrically connected to a portion of the first substrate 110, for example, a circuit for driving the first bit line 140, through a first bit line contact structure 142 connected to the first bit line 140 and disposed under the first bit line 140. The first bit line contact structure 142 may be disposed in the peripheral circuit region PA between the two cell regions CA in the second direction. Although the cross-sectional view of FIG. 2B shows that the first bit line contact structure 142 is made of one contact plug, embodiments are not limited thereto. The first bit line contact structure 142 may include two or more contact plugs or a combination of one or more contact plugs and one or more contact pads. The first bit line contact structure 142 may include any of various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof.

The first memory cells 130 may be disposed in the cell region CA and arranged to overlap intersection regions of the first word lines 120 and the first bit lines 140, respectively. In this embodiment, the first memory cell 130 may have a square pillar shape of which both sidewalls in the first direction are aligned with both sidewalls of the first bit line 140 and both sidewalls in the second direction are aligned with both sidewalls of the first word line 120. However, embodiments are not limited thereto. In another embodiment, the first memory cell 130 may have any of various shapes in a plan view as long as it has a pillar shape overlapping the intersection region of the first word line 120 and the second bit line 140.

The first memory cell 130 may store one of two or more different data according to a voltage or current applied to the first word line 120 and the first bit line 140. As an example, the first memory cell 130 may include a variable resistance element that stores one of the two or more different data by switching between different resistance states according to the voltage or current applied through the first word line 120 and the first bit line 140.

FIG. 2C is a cross-sectional view illustrating the first memory cell 130 according to an embodiment.

Referring to FIG. 2C, the first memory cell 130 may have a multi-layer structure including a first lower electrode layer 131, a first selection element layer 133, a first intermediate electrode layer 135, a first variable resistance layer 137, and a first upper electrode layer 139 that are stacked in the vertical direction.

The first lower electrode layer 131 and the first upper electrode layer 139 may be positioned at lower and upper ends of the first memory cell 130, respectively, to deliver a voltage or current required for an operation of the first memory cell 130. The first intermediate electrode layer 135 may electrically connect the first selection element layer 133 and the first variable resistance layer 137 while physically separating them. The first lower electrode layer 131, the first intermediate electrode layer 135, and the first upper electrode layer 139 each may include any of various conductive materials, for example, a metal such as platinum (Pt), tungsten (W), aluminum (Al), copper (Cu), or tantalum (Ta), a metal nitride such as titanium nitride (TiN) or tantalum nitride (TaN), carbon, or a combination thereof.

The first selection element layer 133 may function to prevent or reduce a current leakage that may occur between the first memory cells 130 sharing the first word line 120 or the first bit line 140. To this end, the first selection element layer 133 may have a threshold switching characteristic. For example, when an applied voltage to the first selection element layer 133 is less than a predetermined threshold value, almost no current flows in the first selection element layer 133. On the other hand, when the applied voltage exceeds the predetermined threshold value, a current flowing in the first selection element layer 133 rapidly increases. This predetermined threshold value may be referred to as a threshold voltage, and the first selection element layer 133 may be implemented in a turn-on state or a turn-off state based on the threshold voltage. The first selection element layer 133 may include a diode, an OTS (Ovonic Threshold Switching) material such as a chalcogenide-based material, an MIEC (Mixed Ionic Electronic Conducting) material such as a metal-containing chalcogenide-based material, an MIT (Metal Insulator Transition) material such as $NbO_2$ or $VO_2$, a tunneling insulating layer having a relatively wide band gap such as $SiO_2$ or $Al_2O_3$, or the like.

The first variable resistance layer 137 may be a part that functions to store data in the first memory cell 130. To this end, the first variable resistance layer 137 may have a variable resistance characteristic of switching between different resistance states according to an applied voltage. The first variable resistance layer 137 may have a single-layer structure or a multi-layer structure including any of various materials used in RRAM, PRAM, FRAM, MRAM, etc. For example, the material of the first variable resistance layer 137 may include a metal oxide such as a transition metal oxide, a perovskite-based material, a phase change material such as a chalcogenide-based material, a ferroelectric material, a ferromagnetic material, or the like.

However, the layer structure of the first memory cell 130 is not limited to the structure shown in FIG. 2C, and the stacking order of the layers of the first memory cell 130 may be changed or at least one of the layers of the first memory cell 130 may be omitted. As an example, one or more of the first lower electrode layer 131, the first selection element layer 133, the first intermediate electrode layer 135, and the first upper electrode layer 139 may be omitted, or stacking positions of the first selection element layer 133 and the first variable resistance layer 137 may be reversed with each other. Alternatively, one or more layers (not shown) may be added to the first memory cell 130 to improve characteristics of the first memory cell 130.

Alternatively, the first memory cell 130 may be a self-selecting memory cell including a layer having functions of both a variable resistance layer and a selection element layer. In this case, the self-selecting memory cell may have a structure in which a self-selection layer, which functions as both a variable resistance layer and a selection element layer, is interposed between a lower electrode and an upper electrode.

Meanwhile, as shown in FIG. 2C, the first memory cell 130 may have a width increasing from top to bottom. This may be because the first memory cell 130 is formed using anisotropic etching, for example, dry etching. In the anisotropic etching, a pattern whose width increases from top to bottom may be obtained as etching residues are deposited on a surface etched.

Referring back to FIGS. 2A and 2B, spaces between the first word lines 120, spaces between the first memory cells 130, spaces between the first bit lines 140, spaces between the first word line contact structures 122, and spaces between the first bit line contact structures 142 over the first substrate 110 may be filled with a first insulating layer 150. The first insulating layer 150 may include any of various insulating materials, and may have a multi-layer structure depending on a process. In particular, when the first insulating layer 150 has a multi-layer structure, at least an uppermost layer of the first insulating layer 150, that is, an insulating layer between the first bit lines 140, may include an insulating material capable of forming a hybrid bond with an uppermost layer of a second insulating layer 250 described later, that is, an insulating layer between second bit lines 240. For example, the insulating layer between the first bit lines 140 may include an insulating material capable of bonding between insulating materials through a covalent bond. For example, the insulating material may include a silicon oxide, a silicon nitride, or a combination thereof. An upper surface of the first insulating layer 150 may be positioned at substantially the same level as an upper surface of the first bit line 140 in the vertical direction. That is, the upper surface of the first insulating layer 150 and the upper surface of the first bit line 140 may form a flat surface.

A brief description of the formation process of the first semiconductor structure 100 described above is as follows. A first insulating material layer may be deposited over the first surface 111 of the first substrate 110, and the first word line contact structure 122 may be formed to be connected to the first substrate 110 by penetrating the first insulating material layer. Subsequently, a first conductive material layer for forming the first word lines 120 and one or more material layers for forming the first memory cells 130 may be deposited over the first insulating material layer, and the first conductive material layer and the one or more material layers may be etched using a first mask pattern extending in the first direction to form an initial first memory cell overlapping each of the first word lines 120.

Subsequently, a second insulating material layer filling spaces between the first word lines 120 and spaces between the initial first memory cells may be formed, and a second conductive material layer for forming the first bit lines 140 may be deposited over the second insulating material layer and the initial first memory cells. Subsequently, the second conductive material layer and the initial first memory cells may be etched using a second mask pattern extending in the second direction to form the first memory cells 130 and the first bit lines 140. Subsequently, a third insulating material layer filling spaces between the first memory cells 130 and spaces between the first bit lines 140 may be formed, and thus, the first semiconductor structure 100 may be obtained. Here, the first insulating material layer, the second insulating material layer, and the third insulating material layer may form the first insulating layer 150.

Referring to FIGS. 1, 3A, and 3B, a second semiconductor structure 200 may be provided. The second semiconductor structure 200 may include a second substrate 210, a plurality of second word lines 220 disposed over a first surface 211 of the second substrate 210, a plurality of second bit lines 240 disposed over the second word lines 220 and crossing the second word lines 220, and a plurality of second memory cells 230 disposed between the second word lines 220 and the second bit lines 240 in the vertical direction and overlapping intersection regions thereof, respectively, when viewed in a plan view.

The second substrate 210 may include a semiconductor material such as silicon. The second substrate 210 may include a cell region CA and a peripheral circuit region PA. Here, since the cell region CA and the peripheral circuit region PA of the second substrate 210 overlap the cell region CA and the peripheral circuit region PA of the first substrate 110, respectively, in a bonding process of the first semiconductor structure 100 and the second semiconductor structure 200 to be described later, the same labels CA and PA are used to indicate the corresponding cell regions and the corresponding peripheral circuit regions, respectively. In addition, the second substrate 210 may be removed in a subsequent process to be described later, and thus, may not include a part that performs an electrical operation, for example, a driving circuit.

The second word line 220 may extend in the first direction, and may include two portions respectively crossing the two cell regions CA arranged in the first direction. These two portions may be referred to as a first portion and a second portion of the second word line 220. The first portion and the second portion of the second word line 220 may be spaced apart from each other in the peripheral circuit region PA between the two cell regions CA arranged in the first direction. Furthermore, the first portion of the second word line 220 may extend further than the first word line 120 from one side of the two cell regions CA in the first direction, for example, toward a left outside with respect to the orientation of FIG. 3A. The second portion of the second word line 220 may extend further than the first word line 120 from the other side of the two cell regions CA in the first direction, for example, toward a right outside with respect to the orientation of FIG. 3A. A part of the first portion of the second word line 220, which protrudes from one side of the two cell regions CA, may be referred to as a first end, and a part of the second portion of the second word line 220, which protrudes from the other side of the two cell regions CA, may be referred to as a second end. Meanwhile, in the second direction, the second word lines 220 may be arranged to be spaced apart from each other while overlapping the first word lines 120, respectively.

The second word line 220 may directly contact the first surface 211 of the second substrate 210. That is, unlike the first word line 210, the second word line 220 may not use a contact structure to be electrically connected to the second substrate 211. This may be because the driving circuit for driving the second word line 220 is present in the aforementioned first substrate 110.

The second bit line 240 may extend in the second direction to cross the cell regions CA arranged in the second direction and the peripheral circuit region PA disposed between the cell regions CA. The second bit lines 240 may be arranged to be spaced apart from each other in the first direction while overlapping the first bit lines 140, respectively. The second bit line 240 may include any of various conductive materials. In particular, the second bit line 240 may include a metallic material capable of forming a hybrid bond with the first bit line 140. The second bit line 240 may include the same metallic material as the first bit line 140.

The second memory cells 230 may be disposed in the cell region CA between the second word lines 220 and the second bit lines 240 in the vertical direction and arranged to overlap intersection regions of the second word lines 220 and the second bit lines 240, respectively, when viewed in a plan view. In this embodiment, the second memory cell 230 may have a square pillar shape of which both sidewalls in the first direction are aligned with both sidewalls of the second bit line 240 and both sidewalls in the second direction are aligned with both sidewalls of the second word line 220. However, embodiments are not limited thereto, and the second memory cell 230 has any of various shapes in a plan view as long as it has a pillar shape overlapping the intersection region of the second word line 220 and the second bit line 240. The second memory cell 230 may have substantially the same pillar shape as the first memory cell 130, and the second memory cells 230 may be arranged to overlap the first memory cells 130, respectively.

The second memory cell 230 may store one of two or more different data according to a voltage or current applied to the second word line 220 and the second bit line 240. As an example, the second memory cell 230 may include a variable resistance element that stores one of the two or more different data by switching between different resistance states according to the voltage or current applied through the second word line 220 and the second bit line 240.

FIG. 3C is a cross-sectional view illustrating the second memory cell 230 according to an embodiment.

Referring to FIG. 3C, the second memory cell 230 may have a multi-layer structure including a second lower electrode layer 231, a second selection element layer 233, a second intermediate electrode layer 235, a second variable resistance layer 237, and a second upper electrode layer 239 that are stacked in the vertical direction.

That is, the second memory cell 230 may have the same layer structure as the first memory cell 130. Furthermore, like the first memory cell 130, the second memory cell 230 may also have a width increasing from top to bottom.

Returning back to FIGS. 3A and 3B, spaces between the second word lines 220, spaces between the second memory cells 230, and spaces between the second bit lines 140 over the second substrate 210 may be filled with a second insulating layer 250. The second insulating layer 250 may include any of various insulating materials, and may have a multi-layer structure depending on a process. In particular, when the second insulating layer 250 has a multi-layer structure, an insulating material layer of the second insulating layer 250 positioned between the second bit lines 240 may include an insulating material capable of forming a hybrid bond with the insulating material layer of the first insulating layer 150 positioned between the first bit lines 240. An upper surface of the second insulating layer 250 may be positioned at substantially the same level as an upper surface of the second bit line 240 in the vertical direction. That is, the upper surface of the second insulating layer 250 and the upper surface of the second bit line 240 may form a flat surface.

A brief description of the formation process of the second semiconductor structure 200 described above is as follows. A first conductive material layer for forming the second word lines 220 and one or more material layers for forming the second memory cells 230 may be deposited over the first surface 211 of the second substrate 210, and the first conductive material layer and the one or more material layers may be etched using a first mask pattern extending in the first direction to form the second word lines 220 and an initial second memory cell overlapping each of the second word lines 220 thereover. Subsequently, a first insulating material layer filling spaces between the second word lines 220 and spaces between the initial second memory cells may be formed, and a second conductive material layer for forming the second bit lines 240 may be formed over the first insulating material layer and the initial second memory cells. Subsequently, the second conductive material layer and the initial second memory cells may be etched using a second mask pattern extending in the second direction to form the second memory cells 230 and the second bit lines 140. Subsequently, a second insulating material layer filling spaces between the second memory cells 230 and spaces between the second bit lines 240 may be formed, and thus, the second semiconductor structure 200 may be obtained. Here, the first insulating material layer and the second insulating material layer may form the second insulating layer 250.

Figure 4B:
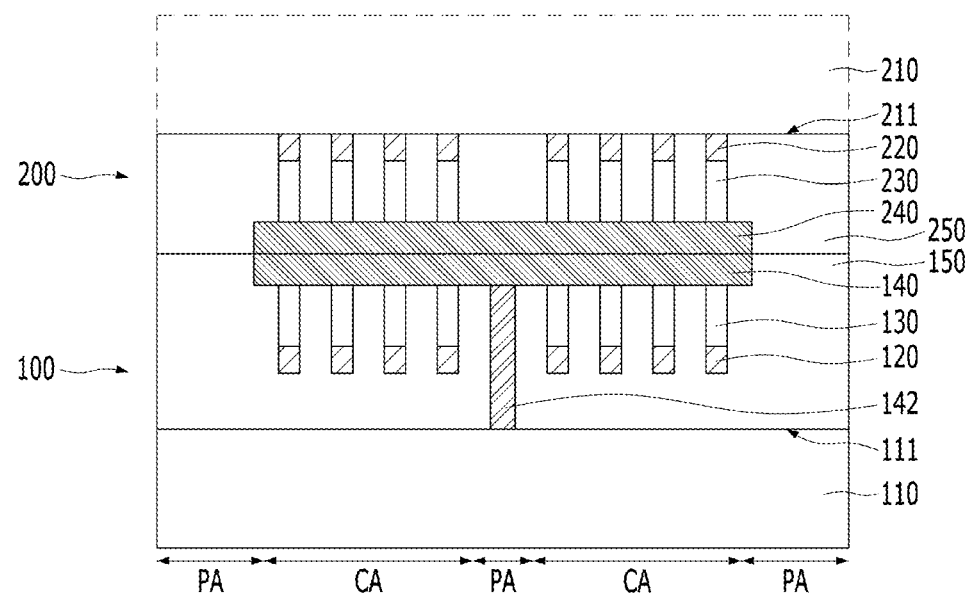

Referring to FIGS. 1, 4A, and 4B, the first semiconductor structure 100 and the second semiconductor structure 200 may be bonded with each other in a state that the first surface 111 of the first substrate 110 and the first surface 211 of the second substrate 210 face each other. As an example, the second semiconductor structure 200 may be disposed over and bonded to the first semiconductor structure 100 in an upside-down state.

Here, the first bit lines 140 and the second bit lines 240 may overlap or be aligned with each other in the vertical direction and directly contact each other. Thus, the first bit line 140 and the second bit line 240 may be electrically connected and driven as one bit line. That is, the first and second bit lines 140 and 240 may function as a common bit line of the first memory cell 130 and the second memory cell 230. In addition, the upper surface of the first insulating layer 150 and the upper surface of the second insulating layer 250 may also be in direct contact with each other. If a heat treatment is performed in this state, the first bit line 140 and the second bit line 240 may be bonded to each other by interdiffusion of metals therein. At the same time, the first insulating layer 150 and the second insulating layer 250 may also be bonded to each other by a covalent bond between insulating materials therein. That is, a hybrid bonding structure including a metal-to-metal bonding between the first bit line 140 and the second bit line 240 and an insulator-to-insulator bonding between the first insulating layer 150 and the second insulating layer 250 may be formed.

Subsequently, the second substrate 210 may be removed. Removal of the second substrate 210 may be performed by a polishing process such as chemical mechanical polishing (CMP).

Meanwhile, since the second semiconductor structure 200 is bonded to the first semiconductor structure 100 in an upside-down state, the second memory cell 230 may also overlap or be aligned with the first memory cell 130 in an upside-down state. This is shown in FIG. 4C.

Figure 4C:
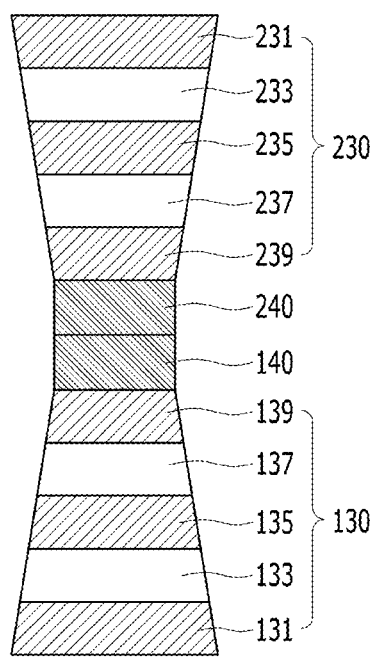

FIG. 4C is a cross-sectional view illustrating the first memory cell 130 and the second memory cell 230 that are aligned in the vertical direction. The first and second bit lines 140 and 240 are disposed between the first memory cell 130 and the second memory cell 230.

Referring to FIG. 4C, the first memory cell 130 may have a width increasing from top to bottom by being disposed in the same manner as in FIG. 2C. On the other hand, the second memory cell 230 may have a width increasing from bottom to top by being disposed in a reversed state of FIG. 3C.

In this case, the first memory cell 130 and the second memory cell 230 may have symmetrical shapes and layer structures in the vertical direction with respect to the first and second bit lines 140 and 240 that are interposed between the first memory cell 130 and the second memory cell 230.

Referring to FIGS. 1, 5A, and 5B, a second word line contact structure 222 may be formed to be electrically connected to a portion of the first substrate 110, for example, a circuit for driving the second word line 220. The second word line contact structure 222 may penetrate the second word line 220, the second insulating layer 250, and the first insulating layer 150. Two second word line contact structures 222 may be disposed in the peripheral circuit regions PA located at the outside of the two cell regions CA arranged in the first direction, and may be connected to the first portion and the second portion of the second word line 220, respectively. That is, the two second word line contact structures 222 may be formed to overlap the first end of the first portion of the second word line 220 and the second end of the second portion of the second word line 220, respectively.

In this embodiment, since the two second word line contact structures 222 are formed in a state in which the first and second semiconductor structures 100 and 200 are bonded to each other, the two second word line contact structures 222 may penetrate the second word line 220.

The second word line contact structure 222 may be formed by forming a mask pattern having an opening exposing a portion of the structure of FIGS. 4A and 4B where the second word line contact structure 222 is to be formed, forming a hole by etching the second word line 220, the second insulating layer 250, and the first insulating layer 150 using the mask pattern as an etching barrier, and filling the hole with a conductive material.

As a result, the semiconductor device shown in FIGS. 1, 5A, and 5B may be fabricated.

Referring back to FIGS. 1, 5A, and 5B, the semiconductor device according to the present embodiment may include the first semiconductor structure 100 and the second semiconductor structure 200 disposed over the first semiconductor structure 100.

The first semiconductor structure 100 may include the first substrate 110, the plurality of first word lines 120 disposed over the first substrate 110 and extending in the first direction, the plurality of first bit lines 140 disposed over the first word lines 120 and extending in the second direction, and the plurality of first memory cells 130 respectively overlapping the intersection regions of the first word lines 120 and the first bit lines 140 and disposed between the first word lines 120 and the first bit lines 140 in the vertical direction.

The second semiconductor structure 200 may include the plurality of second bit lines 240 respectively overlapping and contacting the plurality of first bit lines 140 over the first bit lines 140 and extending in the second direction, the plurality of second word lines 220 disposed over the second bit lines 240 and extending in the first direction, and the plurality of second memory cells 230 respectively overlapping the intersection regions of the second word lines 220 and the second bit lines 240 and disposed between the second word lines 220 and the second bit lines 240 in the vertical direction.

Here, the first semiconductor structure 100 and the second semiconductor structure 200 may be bonded to each other using a hybrid bonding method. That is, the first bit line 140 and the second bit line 240 may form a metal-to-metal bonding, and the first insulating layer 150 and the second insulating layer 250 may form an insulator-to-insulator bonding.

The first word line 120 may be connected to a first word line driving circuit formed in the first substrate 110 through the first word line contact structure 122, the second word line 220 may be connected to a second word line driving circuit formed in the first substrate 110 through the second word line contact structure 222, and the first and second bit lines 140 and 240 may be connected to a bit line driving circuit formed in the first substrate 110 through the first bit line contact structure 142.

A more detailed description for the above components will refer to the above description for the method of fabricating the semiconductor device.

According to the above-described semiconductor device and its fabricating method, the following advantages may be obtained.

First, when a unit structure in which memory cells are interposed between word lines and bit lines crossing each other is referred to as a stack, in the prior art, a process of sequentially stacking two or more stacks is performed over a single substrate. In this case, process difficulty may increase, so that various process defects may occur. For example, in a process of forming an upper stack after a lower stack has been formed, an attack on the lower stack may occur, so that characteristics of memory cells in the lower stack may be deteriorated. Specifically, a thermal budget and/or plasma damage may be accumulated in the lower stack in the process of forming the upper stack, or an attack on the memory cells in the lower stack may occur in an etching process for forming the upper stack. This may create bigger issues as the number of stacks stacked in the vertical direction increases to improve the degree of integration.

On the other hand, in the present embodiment, since the first semiconductor structure 100 including the lower stack and the second semiconductor structure 200 including the upper stack are formed over two different substrates, respectively, and then the first semiconductor structure 100 and the second semiconductor structure 200 are bonded to each other using the hybrid bonding method, it may be possible to prevent or reduce the increase in the process difficulty and the resulting process defects. As a result, production yield of semiconductor devices may be increased.

In addition, since the first semiconductor structure 100 and the second semiconductor structure 200 are formed independently, but the formation processes thereof are performed in substantially the same environment, characteristics of the first semiconductor structure 100 may be substantially the same as characteristics of the second semiconductor structure 200. In particular, the characteristics of the first memory cell 130 and the second memory cell 230 may be substantially the same.

In addition, since the first memory cell 130 and the second memory cell 230 are formed symmetrically with respect to the first and second bit lines 140 and 240 that are interposed between the first memory cell 130 and the second memory cell 230, operating characteristics of the first memory cell 130 and the second memory cell 230 may be substantially the same although the first and second bit lines 140 and 240 function as a common bit line.

On the other hand, if the lower stack and the upper stack are formed in the same manner as in the prior art over the single substrate, a shape of the upper and lower memory cells may have a width increasing from top to bottom, and the upper and lower memory cells may not be symmetrical with respect to the common bit line interposed between the upper memory cell and the lower memory cell. Thus, the first memory cell 130 and the second memory cell 230 may have different operating characteristics.

In addition, by repeatedly stacking one or more semiconductor structures over the first and second semiconductor structures 100 and 200 in a manner similar to the manufacturing method of the second semiconductor structure 200, the degree of integration of the semiconductor device may be further increased. This will be exemplarily described with reference to FIGS. 6A and 6B.

Figure 6A:
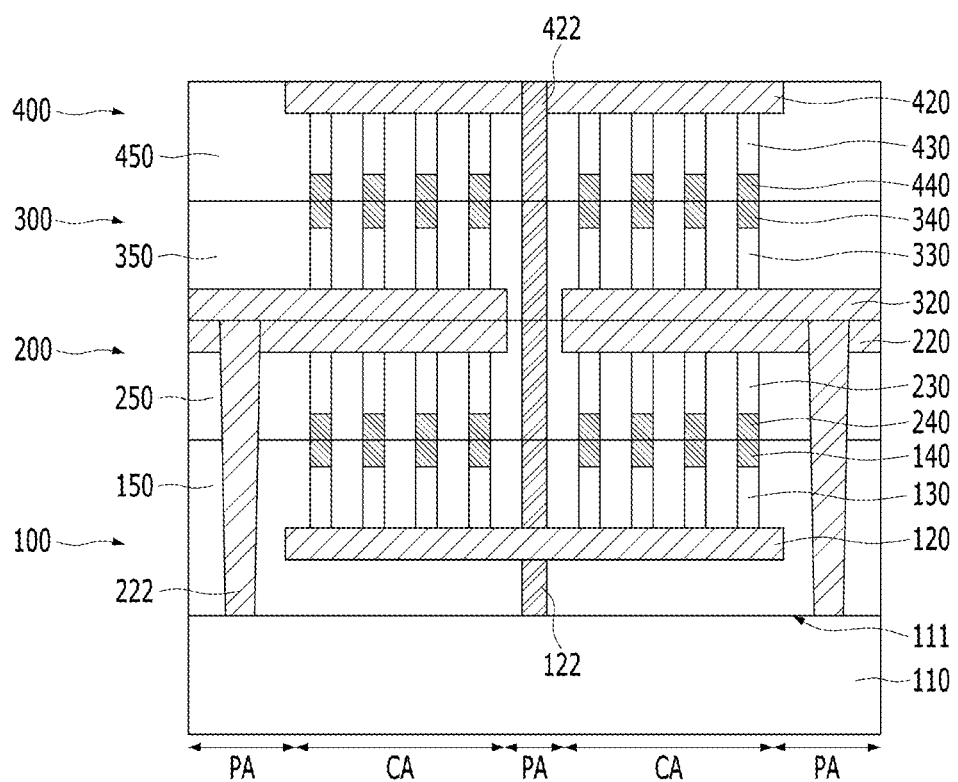
FIGS. 6A and 6B are cross-sectional views illustrating a semiconductor device according to another embodiment of the present disclosure.
Figure 6B:
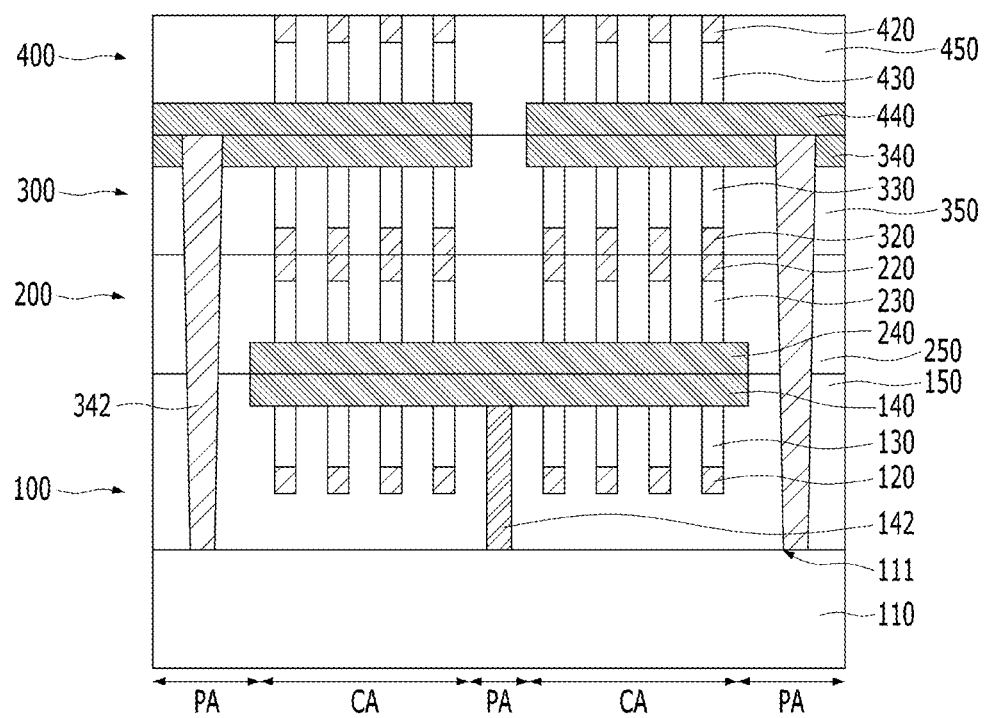

FIGS. 6A and 6B are cross-sectional views illustrating a semiconductor device according to another embodiment of the present disclosure. FIG. 6A is illustrated based on the first direction of FIG. 1, and FIG. 6B is illustrated based on the second direction of FIG. 1. Differences from the aforementioned embodiment will be mainly described.

Referring to FIGS. 6A and 6B, a third semiconductor structure 300 and a fourth semiconductor structure 400 may be stacked over the first and second semiconductor structures 100 and 200 described in FIGS. 5A and 5B.

The third semiconductor structure 300 may include a plurality of third word lines 320 respectively overlapping or aligned with and contacting the plurality of second word lines 220, a plurality of third bit lines 340 disposed over the third word lines 320 and intersecting the third word lines 320, a plurality of third memory cells 330 respectively overlapping intersection regions of the third word lines 320 and the third bit lines 340 and disposed between the third word lines 320 and the third bit lines 340 in the vertical direction, and a third insulating layer 350 filling spaces between the third word lines 320, spaces between the third bit lines 340, and spaces between the third memory cells 330.

Here, the second semiconductor structure 200 and the third semiconductor structure 300 may be bonded to each other using the hybrid bonding method. That is, the second word line 220 and the third word line 320 may form a metal-to-metal bonding, and the second insulating layer 250 and the third insulating layer 350 may form an insulator-to-insulator bonding.

The third word line 320 may function as a common word line by directly contacting the second word line 220, and may be electrically connected to the first substrate 110 through the second word line contact structure 222 penetrating the second word line 220. Since the third word line 320 is formed over the second word line 220, the third word line 320 may directly contact an upper surface of the second word line contact structure 222.

Referring to FIG. 6B, the third bit line 340 may extend in the second direction, and may include two portions that respectively cross the two cell regions CA arranged in the second direction. The two portions of the third bit line 340 may be referred to as a first portion and a second. The first portion and the second portion of the third bit line 340 may be spaced apart from each other in the peripheral circuit region PA that is disposed between the first and second cell regions arranged in the second direction. Furthermore, the first portion of the third bit line 340 may extend further than the first and second bit lines 140 and 240 from one side of the two cell regions CA in the second direction, for example, toward a left outside with respect to the orientation of FIG. 6B. The second portion of the third bit line 340 may extend further than the first and second bit lines 140 and 240 from the other side of the two cell region CAs in the second direction, for example, toward a right outside with respect to the orientation of FIG. 6B.

Therefore, extended parts of the first and second portions of the third bit line 340 may be disposed in the peripheral circuit regions PA at both sides of the two cell regions CA in the second direction, and may be electrically connected to the first substrate 110 through third bit line contact structures 342 penetrating the extended parts of the first and second portions of the third bit line 340, the third insulating layer 350, the second insulating layer 250, and the first insulating layer 150.

The fourth semiconductor structure 400 may include a plurality of fourth bit lines 440 respectively overlapping and contacting the plurality of third bit lines 340, a plurality of fourth word lines 420 disposed over the fourth bit lines 440 and intersecting the fourth bit lines 440, a plurality of fourth memory cells 430 overlapping the intersection regions of the fourth word lines 420 and the fourth bit lines 440 and disposed between the fourth word lines 420 and the fourth bit lines 440 in the vertical direction, and a fourth insulating layer 450 filling spaces between the fourth word lines 420, spaces between the fourth bit lines 440, and spaces between the fourth memory cells 430.

Here, the third semiconductor structure 300 and the fourth semiconductor structure 400 may be bonded to each other using the hybrid bonding method. That is, the third bit line 340 and the fourth bit line 440 may form a metal-to-metal bonding, and the third insulating layer 350 and the fourth insulating layer 450 may form an insulator-to-insulator bonding.

The fourth bit line 440 may function as a common bit line by directly contacting the third bit line 340, and may be electrically connected to the first substrate 110 through the third bit line contact structure 342 penetrating the third bit line 340.

The plurality of fourth word lines 420 may be arranged to overlap the plurality of first word lines 120, respectively, when viewed in a plan view. The fourth word line 420 may be electrically connected to the first word line 120 through a fourth word line contact structure 422 that is disposed in the peripheral circuit region PA between the two adjacent cell regions CA in the first direction as shown in FIG. 6A, and thus may be controlled together with the first word line 120. The fourth word line contact structure 422 may be formed to overlap or be aligned with the first word line contact structure 122, and may be electrically connected to the first word line 120. The fourth word line contact structure 422 may penetrate the fourth word line 420, the fourth insulating layer 450, the third insulating layer 350, the second insulating layer 250, and a portion of the first insulating layer 150. As a result, a semiconductor device including four stacks may be formed, and thus the degree of integration of the semiconductor device may be further increased.

Meanwhile, in the above embodiments, in order to drive a memory cell relatively far from the driving circuit, that is, a memory cell relatively far from the word line contact structure or the bit line contact structure, it may be necessary to supply a large amount of current through the word line and the bit line. However, if the large amount of current is supplied through the word line and the bit line, an overshooting current or spike current may flow through a memory cell relatively close to the driving circuit. The overshooting current or spike current may cause an operation failure in the memory cell relatively close to the driving circuit. Hereinafter, an embodiment capable of reducing or preventing such an operation failure will be described with reference to FIGS. 7A and 7B.

Figure 7A:
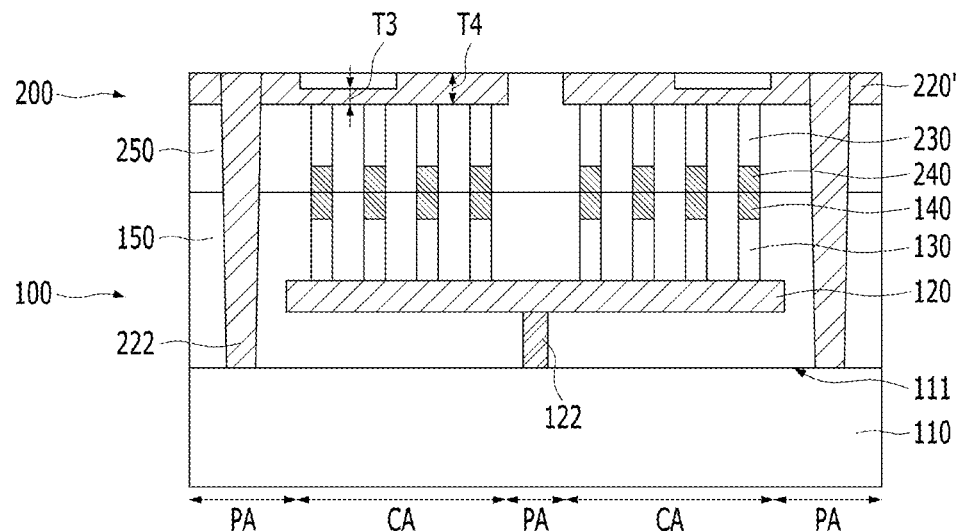
FIGS. 7A and 7B are cross-sectional views illustrating a semiconductor device according to yet another embodiment of the present disclosure.

FIG. 7A is a cross-sectional view illustrating a semiconductor device according to another embodiment of the present disclosure. FIG. 7A is illustrated based on the first direction of FIG. 1. Differences from the aforementioned embodiments will be mainly described.

Referring to FIG. 7A, a portion of a second word line 220' is disposed over at least one second memory cell 230 relatively close to a second word line contact structure 222, for example, two second memory cells 230 relatively close to the second word line contact structure 222. The portion of the second word line 220' may have a third thickness T3, and a remaining portion of the second word line 220' may have a fourth thickness T4 greater than the third thickness T3. In this case, since a resistance value of the portion having the third thickness T3 is greater than a resistance value of the remaining portion having the fourth thickness T4, a total resistance value of the second word line 220' becomes greater than the second word line 220 not including the portion having the third thickness T3. Therefore, an excessive current flowing through the second memory cell 230 relatively close to the second word line contact structure 222 may be reduced or prevented.

The second word line 220' having the above thickness difference may be obtained by etching back a portion of the second word line 220 after obtaining the structure of FIGS. 5A and 5B. An insulating material may fill a space formed by the etch-back process. That is, the insulating material may be formed over the portion having the third thickness T3.

Figure 7B:
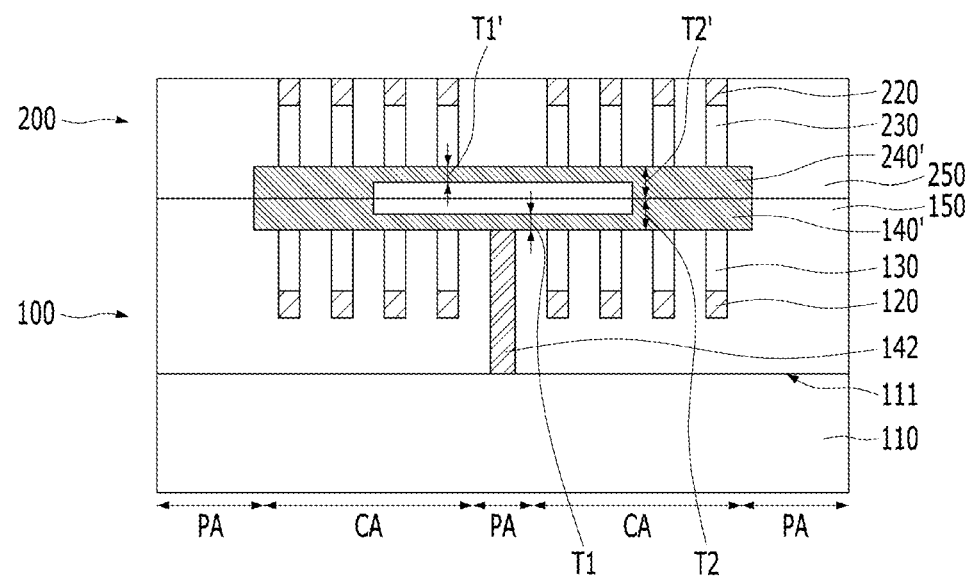

FIG. 7B is a cross-sectional view illustrating a semiconductor device according to another embodiment of the present disclosure. FIG. 7B is illustrated based on the second direction of FIG. 1. Differences from the aforementioned embodiments will be mainly described.

Referring to FIG. 7B, a portion of a first bit line 140' is disposed over at least one first memory cell 130 relatively close to a first bit line contact structure 142, for example, two first memory cells 130 positioned at each of both sides of the first bit line contact structure 142. The portion of the first bit line 140' may have a first thickness T1, and a remaining portion of the first bit line 140' may have a second thickness T2 greater than the first thickness T1. In the first bit line 140', since a resistance value of the portion having the first thickness T1 is greater than a resistance value of the remaining portion having the second thickness T2, a total resistance value of the first bit line 140' becomes greater than the first bit line 140 not including the portion having the first thickness T1. Therefore, an excessive current flowing through the first memory cells 130 relatively close to the first bit line contact structure 142 may be reduced or prevented.

The first bit line 140' having the above thickness difference may be obtained by etching back a portion of the first bit line 140 after obtaining the structure of FIGS. 2A and 2B.

Similarly, a portion of a second bit line 240' is disposed over at least one second memory cell 230 relatively close to the first bit line contact structure 142, for example, two second memory cells 230 positioned at each of both sides of the first bit line contact structure 142. The portion of the second bit line 240' may have a first thickness T1', and a remaining portion of the second bit line 240' may have a second thickness T2' greater than the first thickness T1'. In the second bit line 240', since a resistance value of the portion having the first thickness T1' is greater than a resistance value of the remaining portion having the second thickness T2', a total resistance value of the second bit line 240' becomes greater than the second bit line 240 not including the portion having the first thickness T1'. Therefore, an excessive current flowing through the second memory cells 230 relatively close to the first bit line contact structure 142 may be reduced or prevented.

The second bit line 240' having the above thickness difference may be obtained by etching back a portion of the second bit line 240 after obtaining the structure of FIGS. 3A and 3B.

In this embodiment, both the first bit line 140 and the second bit line 240 are partially etched back. In another embodiment, either one of the first bit line 140 and the second bit line 240 may be partially etched back. That is, the first bit line 140 of FIGS. 2A and 2B may contact the second bit line 240', or the second bit line 240 of FIGS. 3A and 3B may contact the first bit line 140'. Even in this case, since the first bit line 140 and the second bit line 240', or the second bit line 240 and the first bit line 140' directly contact each other to form a common bit line, a resistance value of a portion thereof overlapping the first and second memory cells 130 and 230 relatively close to the first bit line contact structure 142 may be increased compared to other portions thereof.

Also, the structure of FIG. 7A and the structure of FIG. 7B may be combined, or only one of the two structures may be employed in a semiconductor device.

According to the embodiments described above, a semiconductor device capable of reducing process difficulty and increasing the degree of integration while securing uniform memory cell characteristics, and a method of fabricating the same, may be provided.

Although various embodiments have been described for illustrative purposes, it will be apparent to those skilled in the art that various changes and modifications may be made without departing from the spirit and scope of the present teachings as defined in the following claims.

What is claimed is:

1. A semiconductor device comprising:
   a first semiconductor structure including a substrate, a plurality of first word lines disposed over the substrate and extending in a first direction, a plurality of first bit lines disposed over the first word lines and extending in a second direction crossing the first direction, and a plurality of first memory cells respectively disposed in intersection regions between the first word lines and the first bit lines in a third direction perpendicular to the first and the second directions; and
   a second semiconductor structure including a plurality of second bit lines disposed over the first bit lines and respectively contacting the first bit lines, a plurality of second word lines disposed over the second bit lines and extending in the first direction, and a plurality of second memory cells respectively disposed in intersection regions between the second word lines and the second bit lines in the third direction,
   wherein a first bit line and a corresponding second bit line form a metal-to-metal bonding.

2. The semiconductor device according to claim 1, wherein the first semiconductor structure further includes a first insulating layer filling spaces between the first bit lines,
   the second semiconductor structure further includes a second insulating layer filling spaces between the second bit lines, and
   the first insulating layer and the second insulating layer form an insulator-to-insulator bonding.

3. The semiconductor device according to claim 1, further comprising:
   a second word line contact structure configured to electrically connect a second word line to the substrate, and penetrating the second word line.

4. The semiconductor device according to claim 3, further comprising:
   a first word line contact structure configured to electrically connect a first word line to the substrate; and
   a first bit line contact structure configured to electrically connect a first bit line and a second bit line to the substrate.

5. The semiconductor device according to claim 1, wherein a width of a first memory cell increases from top to bottom in the third direction, and
   a width of a second memory cell increases from bottom to top in the third direction.

6. The semiconductor device according to claim 1, wherein a first memory cell and a second memory cell have symmetrical shapes and layer structures with respect to first and second bit lines interposed therebetween.

7. The semiconductor device according to claim 1, further comprising:
   a third semiconductor structure including a plurality of third word lines disposed over the second word lines and respectively contacting the second word lines, a plurality of third bit lines disposed over the third word lines and extending in the second direction, and a plurality of third memory cells respectively disposed in intersection regions between the third word lines and the third bit lines in the third direction, and
   wherein a second word line and a corresponding third word line form a metal-to-metal bonding.

8. The semiconductor device according to claim 7, further comprising:
   a second word line contact structure configured to electrically connect a second word and a corresponding third word line to the substrate, and penetrating the second word line, and
   wherein the third word line directly contacts an upper surface of the second word line contact structure.

9. The semiconductor device according to claim 7, further comprising:
   a second bit line contact structure configured to electrically connect a third bit line to the substrate, and penetrating the third bit line.

10. The semiconductor device according to claim 7, further comprising:
    a fourth semiconductor structure including a plurality of fourth bit lines disposed over the third bit lines and respectively contacting the third bit lines, a plurality of fourth word lines disposed over the fourth bit lines and extending in the first direction, and a plurality of fourth memory cells respectively in intersection regions between the fourth word lines and the fourth bit lines in the third direction, and wherein a third bit line and a corresponding fourth bit line form a metal-to-metal bonding.

11. The semiconductor device according to claim 10, further comprising:
a second bit line contact structure configured to electrically connect a third bit line and a corresponding fourth bit line to substrate, and penetrating the third bit line, and
wherein the fourth bit line directly contacts an upper surface of the third bit line contact structure.

12. The semiconductor device according to claim 10, further comprising:
a third word line contact structure configured to electrically connect a fourth word line to a corresponding first word line, and penetrating the fourth word line.

13. The semiconductor device according to claim 1, further comprising:
a first bit line contact structure configured to electrically connect a first bit line and a corresponding second bit line to the substrate, and
wherein a first portion of the first bit line, which is disposed over one or more first memory cells closer to the first bit line contact structure among the first memory cells, has a thickness less than a thickness of a second portion of the first bit line disposed over first memory cells other than the one or more first memory cells.

14. The semiconductor device according to claim 1, further comprising:
a first bit line contact structure configured to electrically connect a first bit line and a corresponding second bit line to the substrate, and
wherein a first portion of the second bit line, which is disposed under one or more second memory cells closer to the first bit line contact structure among the second memory cells, has a thickness less than a thickness of a second portion of the second bit line disposed under second memory cells other than the one or more second memory cells.

15. The semiconductor device according to claim 1, further comprising:
a second word line contact structure configured to electrically connect a second word line to the substrate, and
wherein a first portion of the second word line, which is disposed over one or more second memory cells closer to the second word line contact structure among the second memory cells, has a thickness less than a thickness of a second portion of the second word line disposed over second memory cells other than the one or more second memory cells.

16. A semiconductor device comprising:
a first semiconductor structure including a substrate, a plurality of first word lines disposed over the substrate and extending in a first direction, a plurality of first bit lines disposed over the first word lines and extending in a second direction crossing the first direction, and a plurality of first memory cells respectively disposed in intersection regions between the first word lines and the first bit lines in a third direction perpendicular to the first and the second directions;
a second semiconductor structure including a plurality of second bit lines disposed over the first bit lines and respectively contacting the first bit lines, a plurality of second word lines disposed over the second bit lines and extending in the first direction, and a plurality of second memory cells respectively disposed in intersection regions between the second word lines and the second bit lines in the third direction; and
a first word line contact structure configured to electrically connect a second word line to the substrate, and penetrating the second word line.

17. The semiconductor device according to claim 16, further comprising:
a second word line contact structure configured to electrically connect a first word line to the substrate; and
a first bit line contact structure configured to electrically connect a first bit line to the substrate.

18. The semiconductor device according to claim 16, further comprising:
a third semiconductor structure including a plurality of third word lines disposed over the second word lines and respectively contacting the second word lines, a plurality of third bit lines disposed over the third word lines and extending in the second direction, and a plurality of third memory cells respectively disposed in intersection regions between the third word lines and the third bit lines in the third direction, and
wherein a third word line corresponding to the second word line directly contacts an upper surface of the first word line contact structure.

19. The semiconductor device according to claim 18, further comprising:
a second bit line contact structure configured to electrically connect a third bit line to the substrate, and penetrating the third bit line.

20. The semiconductor device according to claim 19, further comprising:
a fourth semiconductor structure including a plurality of fourth bit lines disposed over the third bit lines and respectively contacting the third bit lines, a plurality of fourth word lines disposed over the fourth bit lines and extending in the first direction, and a plurality of fourth memory cells respectively disposed in intersection regions between the fourth word lines and the fourth bit lines in the third direction, and
wherein a fourth bit line corresponding to the third bit line directly contacts an upper surface of the second bit line contact structure.

21. The semiconductor device according to claim 20, further comprising:
a third word line contact structure configured to electrically connect a fourth word line to a corresponding first word line, and penetrating the fourth word line.

22. A method of fabricating a semiconductor device, the method comprising:
providing a first semiconductor structure including a first substrate, a plurality of first word lines disposed over the first substrate and extending in a first direction, a plurality of first bit lines disposed over the first word lines and extending in a second direction crossing the first direction, and a plurality of first memory cells respectively disposed in intersection regions between the first word lines and the first bit lines in a third direction perpendicular to the first and the second directions;
providing a second semiconductor structure including a second substrate, a plurality of second word lines disposed over the second substrate and extending in the first direction, a plurality of second bit lines disposed over the second word lines and extending in the second direction, and a plurality of second memory cells respectively disposed in intersection regions between the second word lines and the second bit lines in the third direction; and forming a metal-to-metal bonding between a first bit line and a second bit lines by performing a heat treatment while the first bit line and the second bit line are in direct contact with each other.

23. The method according to claim 22, wherein the first semiconductor structure further includes a first insulating layer filling spaces between the first bit lines, and the second semiconductor structure further includes a second insulating layer filling spaces between the second bit lines, and wherein the method further comprises forming an insulator-to-insulator bonding between the first insulating layer and the second insulating layer during the heat treatment.

24. The method according to claim 22, further comprising:

removing the second substrate after forming the metal-to-metal bonding.

25. The method according to claim 24, further comprising:

forming a word line contact structure electrically connecting a second word line to the first substrate after the removing of the second substrate, the word line contact structure penetrating the second word line.

26. The method according to claim 25, wherein when the word line contact structure is a second word line contact structure, the method further comprises:

forming a first word line contact structure electrically connecting a first word line to the first substrate; and forming a first bit line contact structure electrically connecting a first bit line to the first substrate.

27. The method according to claim 22, wherein, in providing the first semiconductor structure, a first memory cell is formed to have a width that increases from top to bottom in the third direction, in providing the second semiconductor structure, a second memory cell is formed to have a width that increases from top to bottom in the third direction, and in forming the metal-to-metal bonding, the second semiconductor structure is disposed over the first semiconductor structure in an upside-down state.

28. The method according to claim 22, wherein the first semiconductor structure further includes a first bit line contact structure electrically connecting a first bit line to the first substrate, and the method further comprising:

etching back a portion of the first bit line, which is disposed over one or more first memory cells closer to the first bit line contact structure among the first memory cells, to reduce a thickness of the portion of the first bit line after providing of the first semiconductor structure.

29. The method according to claim 22, wherein the second semiconductor structure further includes a first bit line contact structure electrically connecting a second bit line to the second substrate, and the method further comprising:

etching back a portion of the second bit line, which is disposed over one or more second memory cells closer to the first bit line contact structure among the second memory cells, to reduce a thickness of the portion of the second bit line after providing the first semiconductor structure.

30. The method according to claim 25, further comprising:

etching back a portion of the second word line, which is disposed over one or more second memory cells closer to the word line contact structure among the second memory cells, to reduce a thickness of the portion of the second word line after removing the second substrate.

* * * * *